United States Patent
Kohout et al.

(10) Patent No.: US 6,995,483 B2
(45) Date of Patent: Feb. 7, 2006

(54) SYNCHRONOUS BUCK AND BOOST REGULATOR POWER REDUCTION CIRCUIT USING HIGH SIDE SENSING

(75) Inventors: James A. Kohout, Dallas, TX (US); David J. Baldwin, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 415 days.

(21) Appl. No.: 10/271,016

(22) Filed: Oct. 15, 2002

(65) Prior Publication Data

US 2004/0070906 A1    Apr. 15, 2004

(51) Int. Cl.
G05F 3/06 (2006.01)
G05F 1/44 (2006.01)
H03M 1/66 (2006.01)
H02M 3/335 (2006.01)

(52) U.S. Cl. .............. 307/151; 323/271; 323/282; 323/287; 341/144; 363/24

(58) Field of Classification Search ........... 307/104, 307/151
See application file for complete search history.

(56) References Cited

U.S. PATENT DOCUMENTS

| | | | |
|---|---|---|---|
| 4,395,675 A | 7/1983 | Toumani | |
| 4,578,630 A | 3/1986 | Grosch | |
| 4,638,178 A * | 1/1987 | Kayser | 307/85 |
| 4,706,177 A | 11/1987 | Josephson | |
| 5,097,196 A | 3/1992 | Schoneman | |
| 5,177,676 A | 1/1993 | Inam et al. | |
| 5,481,178 A * | 1/1996 | Wilcox et al. | 323/287 |
| 6,366,169 B1 * | 4/2002 | Ivanov | 330/255 |

FOREIGN PATENT DOCUMENTS

EP     428377 A2 *   5/1991

* cited by examiner

Primary Examiner—Brian Sircus
Assistant Examiner—Hal I. Kaplan
(74) Attorney, Agent, or Firm—J. Dennis Moore; W. James Brady, III; Frederick J. Telecky, Jr.

(57) ABSTRACT

A synchronous DC-DC regulator, adapted to receive a high side pulsed signal and a low side pulsed signal that is substantially the inverse of the high side pulsed signal. The regulator includes an inductor, and a capacitor having one port connected to ground, and having a second port providing an output voltage of the DC-DC regulator. A driver is provided for driving pulses of current to the inductor when the high side pulsed signal is asserted. An undercurrent sense circuit is adapted to sense a driving current flowing through the driver and to assert a disable signal when the driving current is less than a predetermined amount. An enable/disable circuit is adapted to allow the low side pulsed signal to turn the switch on when the disable signal is not asserted, and to not allow the low side pulsed signals from turning the switch on when the disable signal is asserted.

9 Claims, 3 Drawing Sheets

SYNCHRONOUS BUCK AND BOOST REGULATOR POWER REDUCTION CIRCUIT USING HIGH SIDE SENSING

TECHNICAL FIELD OF THE INVENTION

This invention relates to DC-DC regulators, and more particularly relates to a circuit and method for reducing power dissipation induced in high current switching DC-DC regulators.

BACKGROUND OF THE INVENTION

DC-DC switching regulators, or, converters, are circuits that use an inductor, a transformer, or a capacitor as an energy storage element to allow the transfer of energy from a switched element connected to its input to its output in discrete packets during the charge phase of a cycle. One type of DC-DC switching regulator uses an inductor as the energy storage element and a capacitor as a charge storage element at the output. Feedback circuitry regulates the energy transfer from the switched element to the energy storage element so as to maintain a relatively constant voltage across the charge storage element, within the load limits of the circuit.

DC-DC switching regulators can be configured to step up (boost) or step down (buck) the output voltage, or both, and can be configured to invert output voltage with respect to input voltage. A benefit of DC-DC switching regulators is their relatively high efficiency. In basic configurations, a so-called "freewheeling" diode, such as a Schottky-type diode, is typically used to allow current to flow from the energy storage element to the charge storage element during the discharge phase of a cycle when the switching element is turned off, but which is reverse-biased during the charge phase of a cycle when the switching element is turned on. A typical operating frequency is on the order of 500 KHz, although the frequency is quite variable, depending on design considerations.

When DC-DC switching regulators are used in high current applications, however, the power dissipation induced by the freewheeling diode of basic designs can be excessive. To alleviate this problem, a switch is sometimes used in the place of the freewheeling diode, and the resulting regulator is said to be synchronous. The switch is typically a metal oxide semiconductor field effect (MOSFET) device.

FIG. 1 shows an exemplary prior art synchronous DC-DC buck regulator. The energy storage element is an inductor L, and the charge storage element is a capacitor C connected between the output and ground. The primary switch for the inductor is an n-type metal oxide semiconductor (NMOS) transistor T1, which is driven by a high side drive, HS Drive, at its control element, i.e., gate, to provide energy to inductor L from the power supply, $V_{SUPPLY}$, when HS Drive is driven high. A second NMOS transistor T2 is connected between the common node of transistor T1 and inductor L, and ground, with its gate being driven by low side drive, LS Drive. As is known, LS Drive is the inverse of HS Drive, with a "dead zone" at transitions to prevent brief moments when both transistors would otherwise be on at the same time. Note that a parasitic diode $D_P$ exists in transistor T2, which must be oriented as shown, to ensure that it is not forward biased during the charge phase. Since parasitic diode $D_P$ has more impedance than transistor T2 during the discharge phase, it essentially serves no purpose in the circuit. In prior art configurations using a freewheeling diode, the diode would be placed where transistor T2 is in this circuit.

In operation, driving pulses are provided at the HS Drive input to the circuit, thereby turning transistor T1 on during those driving pulses. The time when transistor T1 is on is the charge phase of the buck regulator of FIG. 1. During the charge phase, current is driven through inductor L, charging up capacitor C to provide an output voltage $V_{OUT}$. Transistor T2 is off, since LS Drive is low. As capacitor C charges up, the flow of current through inductor L builds its field.

When HS Drive goes low, transistor T1 turns off. The time when transistor T1 is off is the discharge phase. Transistor T2 is on, since LS Drive is high. As soon as transistor T1 is turned off, the voltage across inductor L reverses immediately to maintain current flow. As the inductor L field slowly collapses, current flows in a circuit through inductor L, capacitor C and transistor T2, thereby substantially maintaining the output voltage $V_{OUT}$. The low impedance offered by transistor T2 provides reduced power dissipation, and therefore higher efficiency for the operation of the buck regulator circuit, as compared with prior art configurations that use a freewheeling diode.

The circuit in FIG. 1 includes a prior art overcurrent indicator circuit. The overcurrent indicator circuit is implemented by a third NMOS transistor T3 having its gate connected to the gate of transistor T1, its drain connected to $V_{SUPPLY}$ and its source connected to a senseFET input of an overcurrent sense circuit 10. The source of transistor T1 is connected to the L1 input of overcurrent sense circuit 10.

The transistor T3 is very small compared to transistor T1, for example having a size of approximately 1/10,000 the size of transistor T1, and so draws very little current, while providing a current that mirrors the current through transistor T1 to the senseFET input of overcurrent sense circuit 10, although scaled by the ratio of the size of transistor T1 to transistor T3, thus providing a scaled sense current to the overcurrent sense circuit 10. The voltage at the L1 input is provided as a reference for the sense operation. When the scaled sense current becomes larger than a predetermined amount corresponding to a peak current through transistor T1 that would overload the buck regulator circuit, an overcurrent signal can be provided as an output of the overcurrent sense circuit 10 so that, for example, other circuitry (not shown) can disable the HS Drive and prevent possible damage to the switching circuit.

Now, as mentioned above, the low impedance offered by transistor T2 provides reduced power dissipation, and therefore higher efficiency for the operation of the buck regulator circuit. This can be very important at high load currents. However, the presence of transistor T2 during low load current conditions in systems having a large output voltage dynamic range can be a disadvantage, for two reasons. First, in order to provide a large dynamic range for the output voltage, T2 will have to be much larger than would otherwise be necessary for the very low end of the output voltage range, and so its gate capacitance will be significantly higher than would otherwise be the case. As a result of this large gate capacitance, more energy could be required to switch the device on and off than would be lost through the freewheeling diode that transistor T2 replaces. Secondly, when the output current goes below a certain value, current will actually reverse through the inductor and flow from the output to ground during the second half of the cycle when T2 is on. This current is wasted via heat dissipation of the switching elements as well as discharge to ground.

The same problem arises in other synchronous DC-DC regulator circuits as well, for essentially the same reasons. For example, FIG. 2 shows an exemplary prior art synchronous buck-boost regulator. Like referenced elements operate as described above in connection with the regulator of FIG. 1. However, two additional switches can be seen, NMOS device T4 and pass gate transistor T5. Pass gate transistor T5 may be either an NMOS or PMOS transistor.

In operation, during the charge phase, when HS Drive is driven high, transistors T1 and T4 are turned on, while transistors T2 and T5 are turned off. Thus, current is driven through inductor L to ground, causing the field of inductor L to build. During the discharge phase, when LS Drive is driven high, transistors T2 and T5 are turned on, while transistors T1 and T4 are turned off. Thus, the voltage across inductor L reverses immediately to maintain current flow, and as the inductor L field slowly collapses, current flows in a circuit through inductor L, transistor T5, capacitor C and transistor T2, thereby charging capacitor C and building, and thereafter substantially maintaining, the output voltage $V_{OUT}$, which can be driven to a higher voltage than the input voltage, which is $V_{SUPPLY}$, since the voltage driving the charging of capacitor C is not tied to $V_{SUPPLY}$, as it is in the circuit of FIG. 1. However, it can be seen that the same problems described above exist in the circuit of FIG. 2, as well.

U.S. Pat. No. 5,481,178 discloses a synchronous DC-DC regulator of the type in which current through the inductor is monitored by circuitry coupled to the inductor, and when the inductor current rises above a set threshold, the high side drive is turned off and the low side drive is turned on, for a set interval. Their arrangement forces the output voltage to an overvoltage condition, i.e., higher than normal, during low output current conditions, and then forces both the high side device and low side device off when an overvoltage condition is detected at the output, so that the output voltage is maintained by the charge on the capacitor during low output current conditions. In addition, they disclose an arrangement in which the current through the inductor is monitored by circuitry coupled to the inductor, and when the current through the inductor goes below another set threshold, it forces the low side device off in order to prevent the low side device from drawing power from the load during reversals in output inductor current.

SUMMARY OF THE INVENTION

It would be desirable to have a solution to the above-described problems. Therefore, it is an object of the present invention to provide a synchronous DC-DC regulator having high efficiency at high load currents, while also having high efficiency at low load currents, as well.

In accordance with the present invention, there is provided a synchronous DC-DC regulator, adapted to receive a high side pulsed signal and a low side pulsed signal that is substantially the inverse of the high side pulsed signal. The regulator includes an inductor, and a capacitor having one port connected to ground, and having a second port providing an output voltage of the DC-DC. A driver is provided for driving pulses of current to the inductor when the high side pulsed signal is asserted. A switch and a diode are provided, adapted to provide a path for the inductor to drive current to charge the capacitor when the high side pulsed signal is not asserted. An undercurrent sense circuit is adapted to sense a driving current flowing through the driver and to assert a disable signal when the driving current is less than a predetermined amount. An enable/disable circuit is adapted to allow the low side pulsed signal to turn the switch on when the disable signal is not asserted, and to not allow the low side pulsed signals from turning the switch on when the disable signal is asserted.

These and other features of the invention will be apparent to those skilled in the art from the following detailed description of the invention, taken together with the accompanying drawings.

DETAIL DESCRIPTION OF THE PREFERRED EMBODIMENTS

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 1:
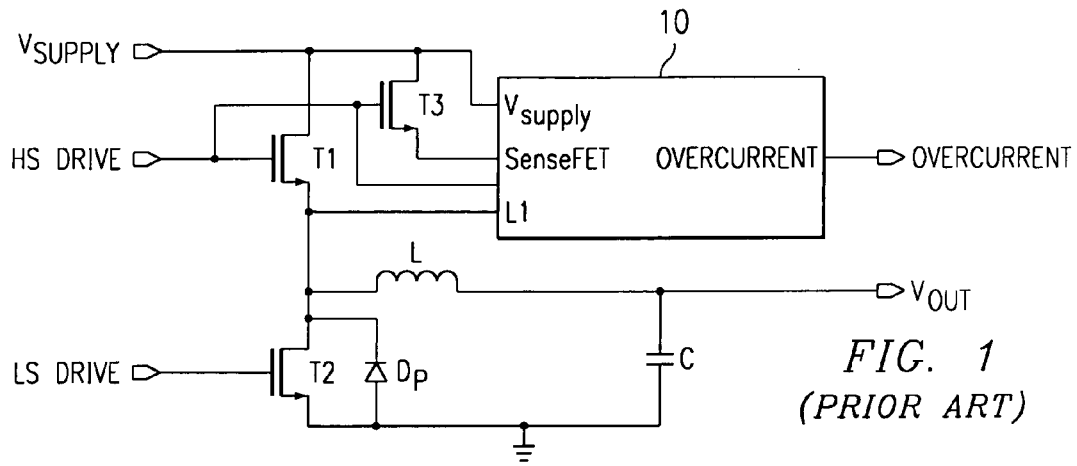
FIG. 1 is a circuit diagram of a prior art buck regulator.
Figure 3:
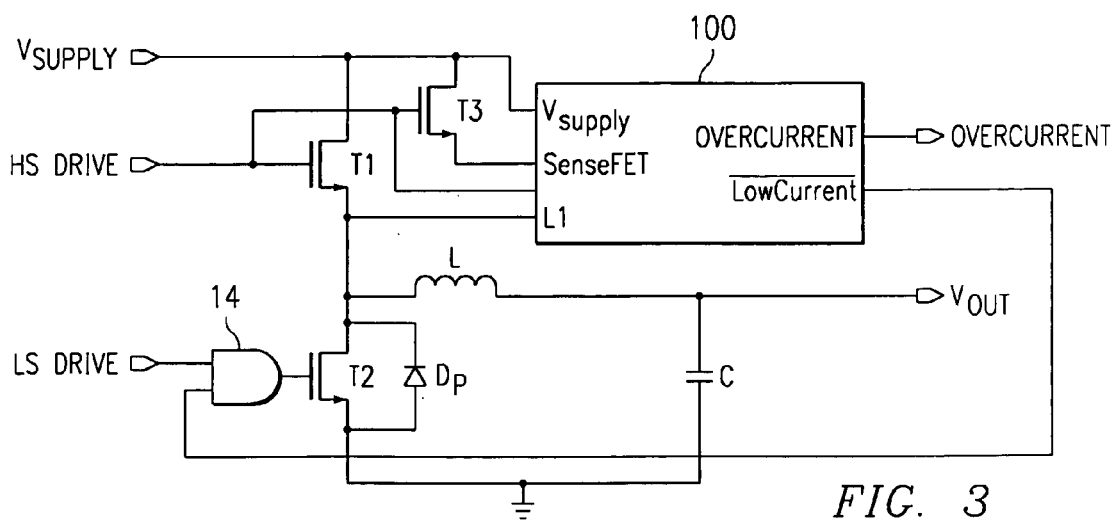
FIG. 3 is a circuit diagram of a buck regulator incorporating a preferred embodiment of the present invention.

FIG. 1 shows a prior art buck regulator circuit, and was described above. FIG. 3 is a circuit diagram of a buck regulator like that of FIG. 1, but incorporating a preferred embodiment of the present invention. Elements with the same reference character as those in FIG. 1 are the same in FIG. 3. As can be seen, a modified overcurrent sense circuit 100 is provided, as well as an AND gate 14 having as one input the LS Drive signal and the other input a LowCurrent output of overcurrent sense circuit 100, with the output of AND gate 14 being connected to the gate of transistor T2.

In operation, the peak current through transistor T1 is sensed and compared to a fixed, trimmed internal current source corresponding to a low current condition for the regulator. If this current exceeds a preset limit, the voltage of output LowCurrent is pulled high, which allows transistor T2 to operate as described above in conjunction with FIG. 1. However, if the peak current is less than the preset limit, the voltage of output LowCurrent is pulled low, blocking, through the function of the AND gate 14, LS Drive from turning transistor T2 on. Rather than having essentially no function in the circuit, parasitic diode $D_P$ now performs as a standard freewheeling diode, thereby saving the energy that would have been required to turn on and off the large switching device, transistor T2. The signal at the output of output LowCurrent can thus be considered an enable signal for the effect of LS Drive on transistor T2 when a low current condition does not exist, or, conversely, as a disable signal for the effect of LS Drive on transistor T2 when a low current condition exists.

Note that while an AND gate is used in the circuit of FIG. 3 to provide the enabling/disabling function described above, other implementations could be devised that provide the same basic function. For example, a NOR gate could be used in place of AND gate 14, in which case a non-inverted, LowCurrent signal would be used (and the inverter 22, described below in conjunction with FIG. 5, would be removed). However, in such an implementation signal LS Drive would have to be inverted before being applied to its input to the NOR gate.

Figure 4:
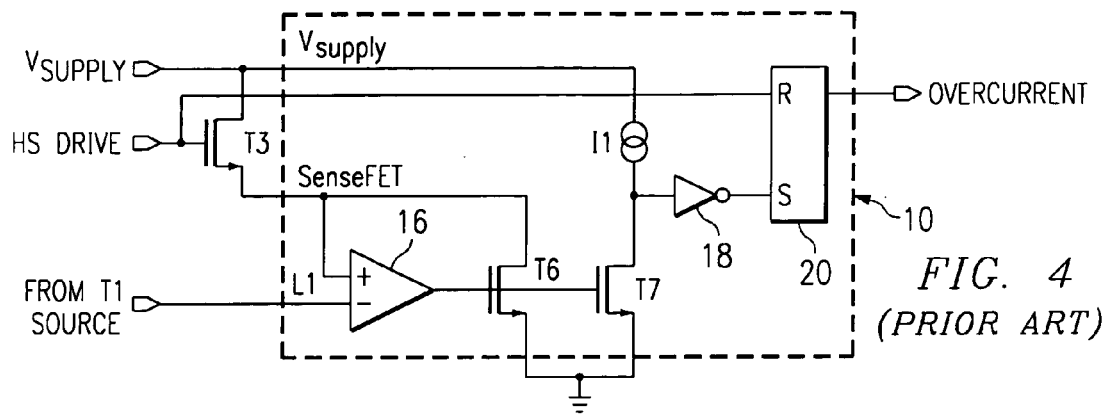
FIG. 4 is a circuit diagram of a prior art overcurrent sense circuit.

The construction of overcurrent sense circuit 100 will now be described. However, before such description it is useful to understand the construction of prior art overcurrent sense circuit 10 of FIG. 1; this circuit is shown in FIG. 4. Transistor T3 is also shown in FIG. 4 to aid in the explanation. As can be seen, the power supply, $V_{SUPPLY}$, is connected to the Vsupply input, the source of transistor T3 is connected to the SenseFET input, and the source of transistor T1 (FIG. 1) is connected to the L1 input of circuit 10. The SenseFET input and L1 input are connected to the positive and negative inputs, respectively, of a differential amplifier 16, while the SenseFET input is also connected to the drain of an NMOS transistor T6, which has its gate connected to the output of differential amplifier 16, and its source connected to ground. The output of differential amplifier 16 is also connected to the gate of another NMOS transistor T7, which has its source connected to ground, and its drain connected to $V_{SUPPLY}$ through a current source I1. The common connection node of transistor T7 and current source I1 is connected to the input of an inverter 18, the output of which is connected to the set input of a set/reset latch 20, with the HS Drive being connected to the reset input of latch 20. The output of latch 20 is the Overcurrent output of overcurrent sense circuit 10.

In operation, differential amplifier 16 functions to drive the voltages at its input to the same level. It will be recalled that the current through transistor T3 is a scaled sense current corresponding to the current through transistor T1. With the inverting input of differential amplifier 16 being tied to the transistor T1 source, differential amplifier 16 adjusts its output to drive the gate of transistor T6 to a level at which the voltage at the non-inverting input of differential amplifier 16, i.e., the SenseFET input, is substantially at the level of the voltage at the L1 input. Since the gate of transistor T7 is connected to the gate of transistor T6, the current through transistor T6, and therefore also through transistor T3, is mirrored to transistor T7. When the current sunk through transistor T7 exceeds the current sourced by current source I1, the input of inverter 18 is pulled low, raising the level of the set input of latch 20, causing the output of latch 20 to go high, signaling an overcurrent condition. The size of transistors T3, T6 and T7, the gain of amplifier 16 and the magnitude of current source I1 are selected such that latch 20 is set when a peak current exists through transistor T1 that would overload the buck regulator circuit, or some selected current less than that to provide a protective margin for the buck regulator circuit. For an exemplary circuit, current source I1 might be selected to source a current of 10 microamps ($\mu$a), with other components sized and set accordingly.

The purpose of latch 20 is to hold the overcurrent signal high for the duration of the HS Drive pulse in which the overcurrent condition occurred, and then release it to go low.

Figure 5:
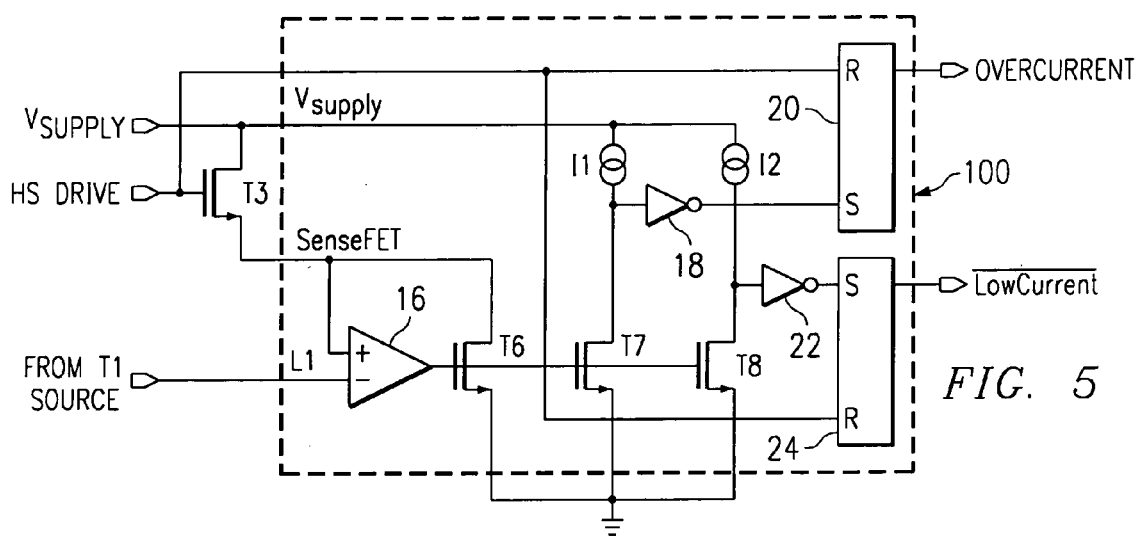
FIG. 5 is a circuit diagram of an overcurrent sense circuit incorporating a preferred embodiment of the present invention.

Now, FIG. 5 is a circuit diagram of overcurrent sense circuit 100 of FIG. 3. Elements with the same reference character as those in FIG. 4 are the same in FIG. 5. As can be seen, an NMOS transistor T8, current source I2, inverter 22 and latch 24, together with amplifier 16 forming an undercurrent sense circuit, have been added to the circuit of FIG. 4 to construct the circuit of FIG. 5. The size of transistor T8 and the value of current source I2, relative to the size of transistors T3 and T6, and the gain of amplifier 16, are selected such that when the current through transistor T1 (FIG. 3) is less than a selected undercurrent amount below which it is desired to block the operation of transistor T2, the differential amplifier drives transistor T8 to conduct less current than current source I2 can supply, causing the input of inverter 22 to be pulled high by current source I2. This causes the output of inverter 22 to go low, which, in turn, causes the output of latch 24, which is the LowCurrent signal, to go low, thus holding its input to AND gate 14 low and blocking LS Drive from turning transistor T2 on. For an exemplary circuit with circuit elements as described above in connection with FIG. 4, i.e., current source I1 sources 10 $\mu$a, etc., current source I2 might be selected to source a current of 2.5 $\mu$a. In such a circuit, when the difference in voltage between inputs SenseFET and L1 is less than the undercurrent voltage, transistor T8 is driven to sink less than 2.5 $\mu$a, which causes the LowCurrent signal to go low. The purpose of latch 24 is to hold the LowCurrent signal low for at least the duration of the LS Drive pulse following the HS Drive pulse in which the low current condition occured, and then release it to go high when the low current condition no longer exists.

It will be appreciated that while the circuit shown in FIG. 5 is considered preferred, other implementations can be devised, whether in circuitry, firmware, software, or a combination of any of those, that provide the same function, and are considered within the scope of the invention. The essential function is to sense an undercurrent condition through the primary switch transistor such as transistor T1 and provide a signal when such undercurrent condition is sensed, which signal can be used to disable operation of a transistor such as transistor T2 that is used in the place of a freewheeling diode in a DC-DC regulator.

As mentioned above, the invention may be implemented in other types of synchronous DC-DC regulators, having the same basic problems described above. Two other such regulators are described hereinbelow, but they are not to be taken as limiting, but rather as further examples among many. Also note that while the switching devices in the implementations described above are mostly NMOS transistors, the devices in general could be PMOS, as well. The circuit could also be a combination of NMOS and PMOS, for example with PMOS devices for high-side components and NMOS for low-side components, which would eliminate the need for a charge pump or bootstrap, in most cases. The application of the present invention to all such designs is considered to be within the scope of the invention as claimed herein.

Figure 2:
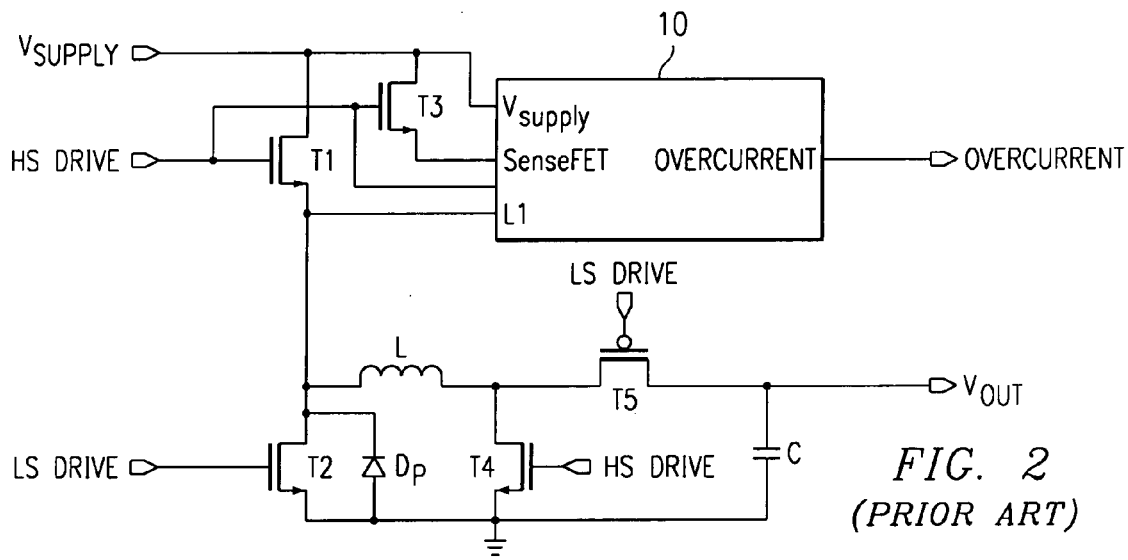
FIG. 2 is a circuit diagram of a prior art non-inverting buck-boost regulator.
Figure 6:
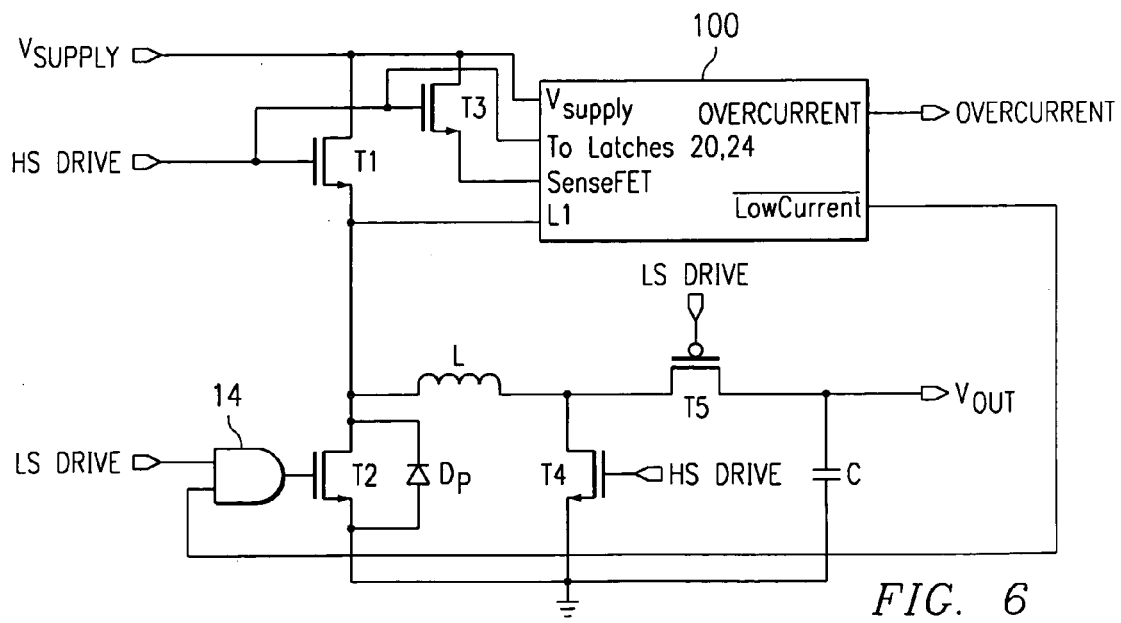
FIG. 6 is a circuit diagram of a non-inverting buck-boost regulator incorporating a preferred embodiment of the present invention.

FIG. 2 shows a prior art buck-boost regulator circuit, and was described above. FIG. 6 is a circuit diagram of a buck-boost regulator like that of FIG. 2, but incorporating another preferred embodiment of the present invention. Elements with the same reference character as those in FIG. 2 are the same in FIG. 6. As can be seen, a modified overcurrent sense circuit 100 is provided, as well as an AND gate 14 having as one input the LS Drive signal and the other input a LowCurrent output of overcurrent sense circuit 100, with the output of AND gate 14 being connected to the gate of transistor T2. These additional components operate in essentially the same manner as the same numbered components described above in connection with FIG. 3.

Figure 7:
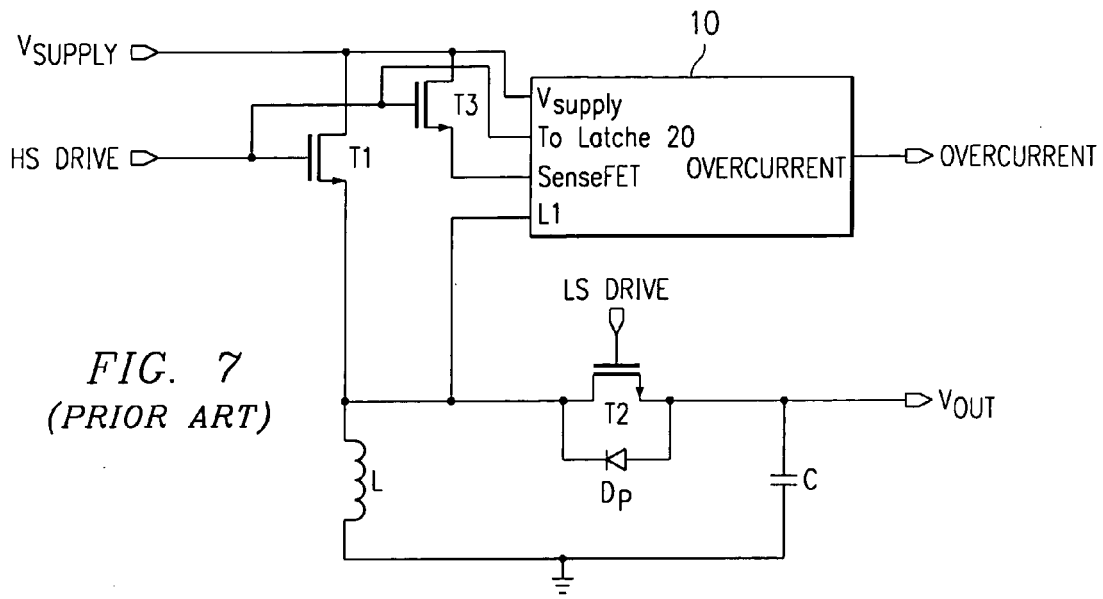
FIG. 7 is a circuit diagram of a prior art inverting buck-boost regulator.

FIG. 7 shows another type of prior art buck-boost regulator circuit, in which the output voltage $V_{OUT}$ is inverted with respect to the input voltage, which is $V_{SUPPLY}$. The circuit is similar in some respects to the circuit in FIG. 2, with HS Drive driving a transistor T1 during the charge phase, LS Drive driving a transistor T2 during the discharge phase, transistor T3 and overcurrent sense circuit 10 serving as an overcurrent indicator circuit. However, during the charge phase, when HS Drive is driven high, transistor T1 is turned on, while transistor T2 is turned off, current is driven through inductor L to ground, causing the field of inductor L to build. During the discharge phase, when LS Drive is driven high, transistor T2 is turned on, while transistor T1 is turned off, at which time the voltage across inductor L reverses immediately to maintain current flow, and as the inductor L field slowly collapses, current flows in a circuit through inductor L, transistor T2 and capacitor C, thereby charging capacitor C and building, and thereafter substantially maintaining, the output voltage $V_{OUT}$, which can be driven to a higher voltage than the input voltage, which is $V_{SUPPLY}$, since the voltage driving the charging of capacitor C is not tied to $V_{SUPPLY}$. However, it can be seen that the same problems described above in connection with the circuit of FIG. 1 exist in the circuit of FIG. 7, as well.

Figure 8:
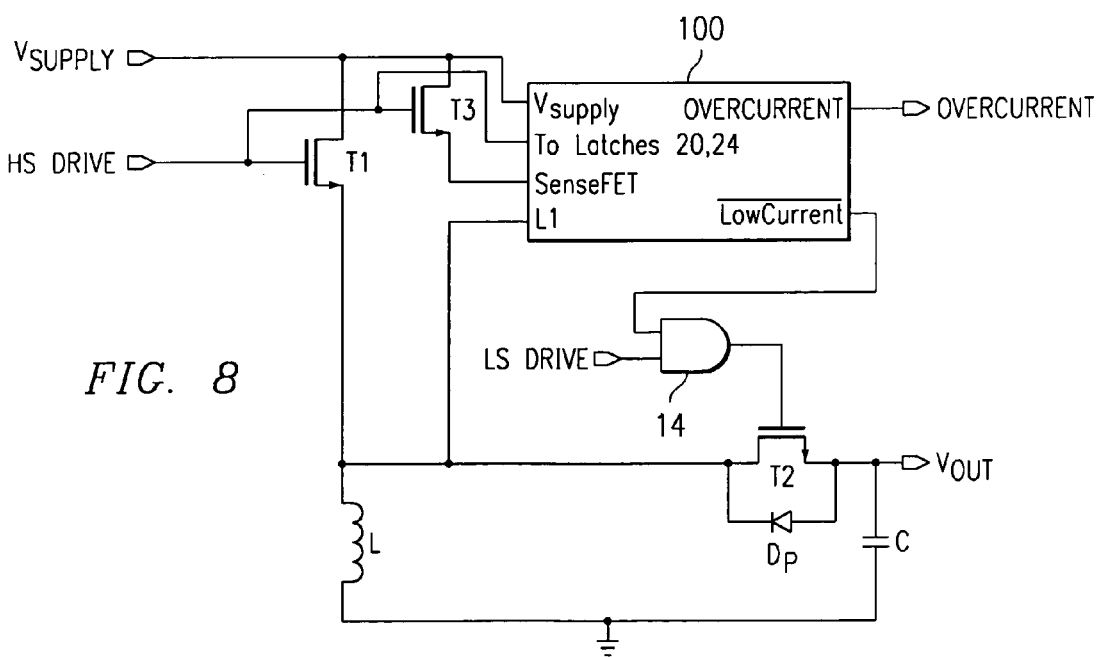
FIG. 8 is a circuit diagram of an inverting buck-boost regulator incorporating a preferred embodiment of the present invention.

FIG. 8 is a circuit diagram of a buck-boost regulator like that of FIG. 7, but incorporating another preferred embodiment of the present invention. Elements with the same reference character as those in FIG. 7 are the same in FIG. 8. As can be seen, a modified overcurrent sense circuit 100 is provided, as well as an AND gate 14 having as one input the LS Drive signal and the other input a LowCurrent output of overcurrent sense circuit 100, with the output of AND gate 14 being connected to the gate of transistor T2. These additional components operate in essentially the same manner as the same numbered components described above in connection with FIG. 3.

Although the present invention and its advantages have been described in detail, it should be understood that various changes, substitutions and alterations can be made herein without departing from the spirit and scope of the invention as defined by the appended claims.

What is claimed is:

1. A synchronous DC-DC regulator, adapted to receive a high side pulsed signal and a low side pulsed signal that is substantially the inverse of the high side pulsed signal, comprising:
   an inductor;
   a capacitor having one port connected to ground, and having a second port providing an output voltage of the DC-DC regulator;
   a driver for driving pulses of current to the inductor when the high side pulsed signal is asserted;
   a switch and a diode adapted to provide a path for the inductor to drive current to charge the capacitor when the high side pulsed signal is not asserted;
   an undercurrent sense circuit adapted to sense a driving current flowing through the driver and to assert a disable signal when the driving current is less than a predetermined amount; and
   an enable/disable circuit adapted to enable the low side pulsed signal to turn the switch on when the disable signal is not asserted, and to selectively disable the low side pulsed signal from turning the switch on, while allowing the driver to continue to drive pulses, when the disable signal is asserted.

2. A synchronous DC-DC switching regulator as in claim 1, wherein the switch comprises a MOSFET transistor, and wherein the diode comprises a parasitic diode formed as part of the MOSFET transistor.

3. A synchronous DC-DC switching regulator as in claim 1, wherein the undercurrent sense circuit comprises:
   a current sense circuit adapted to sense the driving current through the driver and provide a scaled current in response thereto; and
   a current source connected to the current sense circuit, whereby a voltage at the common node of the current sense circuit and current source depends on whether the driving current is more than or less than the predetermined amount.

4. A synchronous DC-DC regulator, adapted to receive a high side pulsed signal and a low side pulsed signal that is substantially the inverse of the high side pulsed signal, comprising:
   an inductor, having a first port and a second port;
   a capacitor connected between the second port of the inductor and ground, the common connection node of the capacitor and the inductor providing an output voltage of the DC-DC switching regulator;
   a driver for driving pulses of current to the first port of the inductor when the high side pulsed signal is asserted;
   a switch and a diode connected in parallel between the first port of the inductor and ground;
   an undercurrent sense circuit adapted to sense a driving current flowing through the driver and to assert a disable signal when the driving current is less than a predetermined amount; and
   an enable/disable circuit adapted to enable the low side pulsed signal to turn the switch on when the disable signal is not asserted, and to selectively disable the low side pulsed signal from turning the switch on, while allowing the driver to continue to drive pulses, when the disable signal is asserted.

5. A synchronous DC-DC switching regulator as in claim 4, wherein the switch comprises a MOSFET transistor, and wherein the diode comprises a parasitic diode formed as part of the MOSFET transistor.

6. A synchronous DC-DC switching regulator as in claim 4, wherein the undercurrent sense circuit comprises:
   a current sense circuit adapted to sense a driving current through the driver and provide a scaled current in response thereto; and
   a current source connected to the current sense circuit, whereby a voltage at the common node of the current sense circuit and current source depends on whether the driving current is more than or less than the predetermined amount.

7. A synchronous DC-DC switching regulator as in claim 4, wherein:
   the switch comprises a MOSFET transistor connected between the common connection node of the inductor and the driver, and ground, and having a gate; and
   the enable/disable circuit comprises a two-input AND gate adapted to receive the low side pulsed signal at a first input and to receive the disable signal at a second input, having its output connected to the gate of the transistor, wherein the disable signal is asserted as a low logic signal.

8. A synchronous DC-DC regulator, adapted to receive a high side pulsed signal and a low side pulsed signal that is substantially the inverse of the high side pulsed signal, comprising:
- an inductor, having a first port, and having a second port;
- a driver for driving pulses of current to the first port of the inductor when the high side pulsed signal is asserted;
- a capacitor having a first port, and having a second port connected to ground;
- a first switch and a diode connected in parallel between the first port of the inductor and ground;
- a second switch connected between the second port of the inductor and ground;
- a third switch connected between the common connection node of the second switch and the inductor, and the first port of the capacitor, a coupling node of the third switch and the capacitor providing an output voltage of the DC-DC switching regulator;
- an undercurrent sense circuit adapted to sense an operating current flowing through the driver and to assert a disable signal when the operating current is less than a predetermined amount; and
- an enable/disable circuit adapted to enable the low side pulsed signal to turn the first switch on when the disable signal is not asserted, and to selectively disable the low side pulsed signal to turn the first switch on, while allowing the driver to continue to drive pulses, when the disable signal is asserted.

9. A synchronous DC-DC regulator, adapted to receive a high side pulsed signal and a low side pulsed signal that is substantially the inverse of the high side pulsed signal, comprising:
- an inductor, having a first port, and having a second port connected to ground;
- a driver for driving pulses of current to the first port of the inductor when the high side pulsed signal is asserted;
- a capacitor having a first port, and having a second port connected to ground;
- a switch and a diode connected in parallel between the first port of the inductor and the first port of the capacitor, a coupling node of the switch and the capacitor providing an output voltage of the DC-DC switching regulator;
- an undercurrent sense circuit adapted to sense an operating current flowing through the driver and to assert a disable signal when the operating current is less than a predetermined amount; and
- an enable/disable circuit adapted to enable the low side pulsed signal to turn the switch on when the disable signal is not asserted, and to selectively disable the low side pulsed signal from turning the switch on, while allowing the driver to continue to drive pulses, when the disable signal is asserted.

* * * * *